United States Patent [19]

Dechelette

[11] 4,387,509
[45] Jun. 14, 1983

[54] METHOD OF MANUFACTURING AN ELECTRICAL INTERCONNECTION ASSEMBLY

[75] Inventor: Helen Dechelette, St. Cloud, France

[73] Assignee: AMP Incorporated, Harrisburg, Pa.

[21] Appl. No.: 293,561

[22] Filed: Aug. 17, 1981

[51] Int. Cl.³ ............................................... H01K 3/10
[52] U.S. Cl. ........................................ 29/850; 29/749; 83/620; 140/93 R
[58] Field of Search ............... 29/749, 423, 850, 857, 29/872, 750, 751; 140/92.1, 93 R; 83/451, 620

[56] References Cited

U.S. PATENT DOCUMENTS

| | | | |
|---|---|---|---|
| 3,079,672 | 3/1963 | Bain, Jr. et al. | 29/850 |
| 3,253,324 | 5/1966 | Frey et al. | 29/850 X |
| 3,279,040 | 10/1966 | Propster, Jr. | 29/850 X |
| 3,295,189 | 1/1967 | Hammell | 29/857 |
| 3,550,236 | 12/1970 | Lienert | 29/423 X |
| 3,631,594 | 1/1972 | Dietrich | 29/423 X |

FOREIGN PATENT DOCUMENTS 1448609  9/1976  United Kingdom ................. 29/846

*Primary Examiner*—Francis S. Husar
*Assistant Examiner*—Carl J. Arbes
*Attorney, Agent, or Firm*—Frederick W. Raring

[57] ABSTRACT

A method of manufacturing an electrical interconnection assembly such as an automobile harness junction box, comprises laying a wire in a groove in a substrate; cutting the wire in the groove into a plurality of pieces; and then transferring the pieces of wire from the groove on to terminals carried by an insulating support to form the assembly.

10 Claims, 8 Drawing Figures

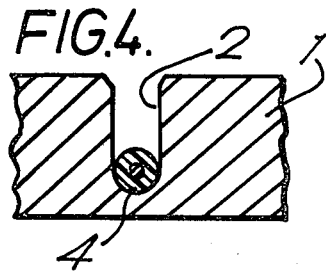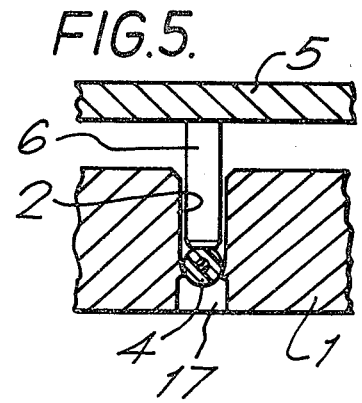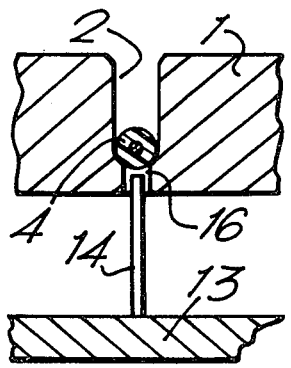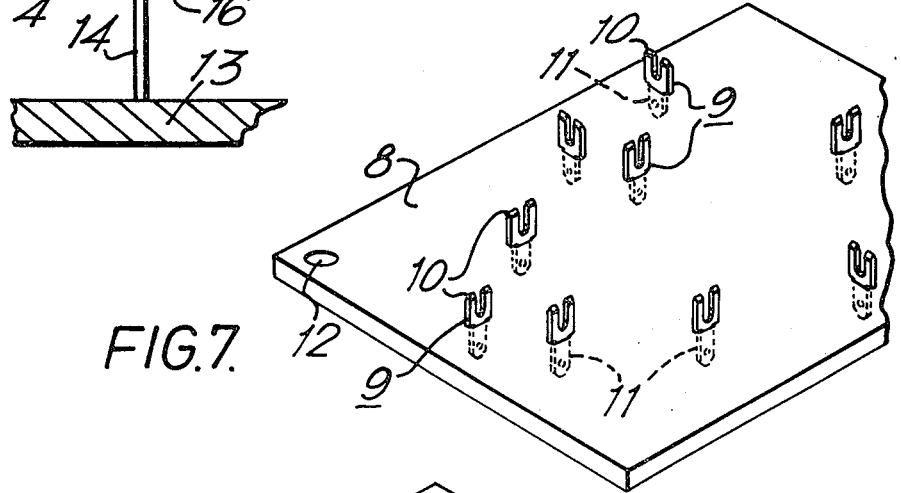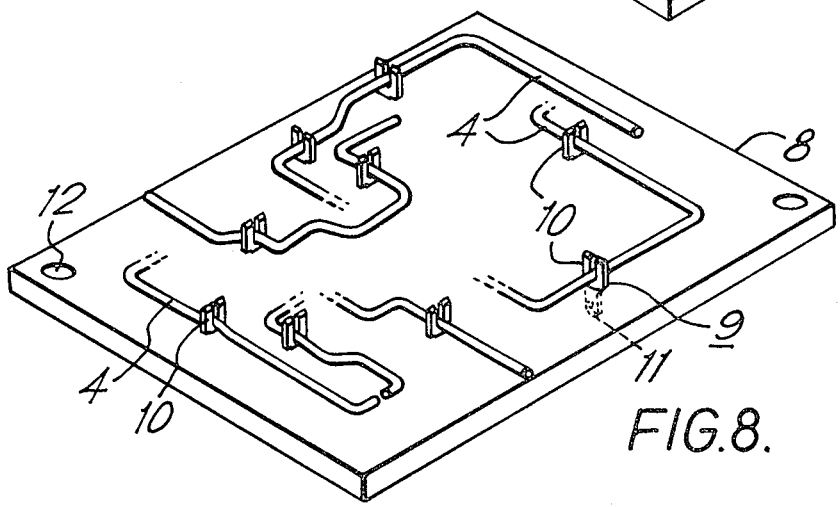

METHOD OF MANUFACTURING AN ELECTRICAL INTERCONNECTION ASSEMBLY

This invention relates to a method of manufacturing an electrical interconnection assembly comprising a plurality of electrical terminals carried by a common electrically insulating support and interconnected in a predetermined arrangement by electrical conductors.

Such assemblies find many uses in electrical devices and equipment, a particular use being as a so-called central junction unit in the electrical wiring of an automobile, where the assembly would serve to interconnect various parts of the wiring harness of the automobile and would carry, for example, fuses and relays connected into the wiring harness.

Known such central junction units comprise one or more printed circuit boards constituting the electrically insulating support and electrical conductors of the assembly, the fuses and relays being mounted on appropriate terminals mounted on the board, and the parts of the wiring harness being connected to the conductors on the board by means of conventional printed circuit board edge connectors.

These known assemblies suffer from the disadvantages that they are relatively expensive in that they use conventional printed circuit boards and edge connectors, and are also relatively difficult and time-consuming to manufacture in requiring terminals to be soldered to the conductors on the printed circuit board, this adding further to the cost of the assembly.

According to this invention a method of manufacturing an electrical interconnection assembly as set out above includes the steps of laying a continuous length of insulated electrical wire in a groove formed in a template; cutting the length of wire in the groove into a plurality of pieces; and urging the pieces of wire from the groove on to an insulating support carrying a plurality of electrical terminals each having a slotted plate portion providing an insulation displacement slot which receives a piece of wire and establishes an electrical connection thereto whereby the terminals become interconnected by the pieces of wire in the predetermined arrangement.

The method of this invention has the advantages that it is simple and quick, and thus cheap, to carry out, and avoids the use of conventional printed circuit boards and edge connectors therefor.

The template can be of metal, for example aluminium, and the groove can be cut therein using a computer controlled machine. The same computer programme can then be used to control an automatic machine serving to lay the wire in the groove, the wire laying head following the same route along the groove as was followed by the tool forming the groove.

Preferably the wire used has a solid core since this makes the wire relatively rigid and thus helps to retain the wire in the groove.

The length of wire can be cut into a plurality of pieces while in the groove by means of an appropriate array of cutting pins projecting from a carrier plate which is urged towards the grooved side of the template, the cutting pins engaging the wire and cutting it against the sides of holes formed in the bottom of the groove into which holes the cutting pins pass after having cut the wire.

The pieces of wire in the groove in the template after the cutting operation can be urged from the groove by means of an appropriate array of ejection pins carried by an ejection plate which is urged towards the face of the template remote from the groove, the ejection pins entering holes in the template communicating with the groove thereby to engage the pieces of wire and urge them out of the groove.

Preferably the array of ejection pins includes at least two associated with each terminal slotted plate portion, which two ejection pins engage a piece of wire on opposite sides of and adjacent the associated slotted plate portion thereby to serve as stuffers to urge the piece of wire into the slot in the associated slotted plate portion.

The electrical terminals can each have a slotted plate portion projecting from one face of the insulating support for receipt of a piece of wire, and an integrally formed contact portion projecting from an opposite face of the insulating support for mating with a terminal terminating a conductor or device to be connected to the assembly. Thus, the contact portion of a terminal can be a male tab for mating with a tab receptacle terminating a conductor, or a receptacle for receiving an end of a cartridge fuse, or a receptacle for receiving a tab on, for example, a flat blade fuse or a relay.

If more than one piece of wire is to be connected to a particular terminal then the slotted plate portion of that terminal can be provided with the appropriate number of slots, the groove in the template following the path necessary to direct the relevant pieces of wire for connection to these slots.

After manufacture the insulating support carrying the terminals with the pieces of wire connected thereto can be mounted in a box of insulating material suitable for mounting, for example, in an automobile, with the contact portions of the terminals accessible as necessary from outside the box.

Preferably the members making up the box are formed with inwardly directed webs which project between the slotted plate and/or contact portions of adjacent terminals to prevent unwanted short circuit connections between such terminals.

The method of this invention can be carried out on many different types of machine. For example the wire laying, cutting and push out steps can all be carried out at a single station with appropriate changes in the tool operative at the station, or otherwise the wire laying step can be carried out at one station with the insulating support with the wire in the groove therein then being moved to a second station for the cutting and push out steps to be carried out.

Further, the machine can be one which operates on a plurality of identical assemblies simultaneously whereby one computer programme can be used to control a plurality of wire laying heads.

This invention will now be described by way of example with reference to the diagrammatic drawings, in which:

FIG. 4 is a sectional view showing a detail of the groove in the template of FIG. 1;

FIG. 5 is a sectional view showing a detail of the groove in the template of FIG. 1 at the position of a cutting-pin-receiving hole;

FIG. 6 is a sectional view showing a detail of the groove in the template of FIG. 1 at the position of an ejection-pin-receiving hole;

FIG. 7 is a perspective view of an insulating support carrying a plurality of electrical terminals; and FIG. 8 is a perspective view of an assembly manufactured by the method of the invention using the apparatus shown in FIGS. 1 to 7.

Figure 1:
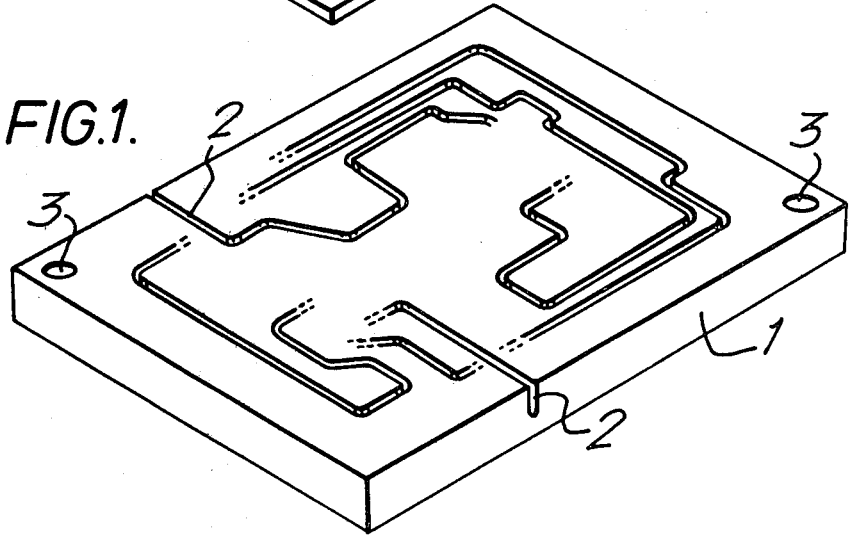
FIG. 1 is a perspective view of a template with a groove therein.

FIG. 1 shows a template 1 in the form of a planar rectangular plate of aluminium having a groove 2 cut therein in accordance with a predetermined pattern. At two diagonally opposite corners the plate 1 is formed with through holes 3 by which the plate 1 can be accurately located on a machine bed. The groove 2 is cut in the plate 1 by means of a computer controlled machine.

Under the control of the programme used for cutting the groove 2 a machine then lays a continuous length of solid core insulated wire 4 (FIGS. 4, 5 and 6) in the groove 2.

Figure 2:
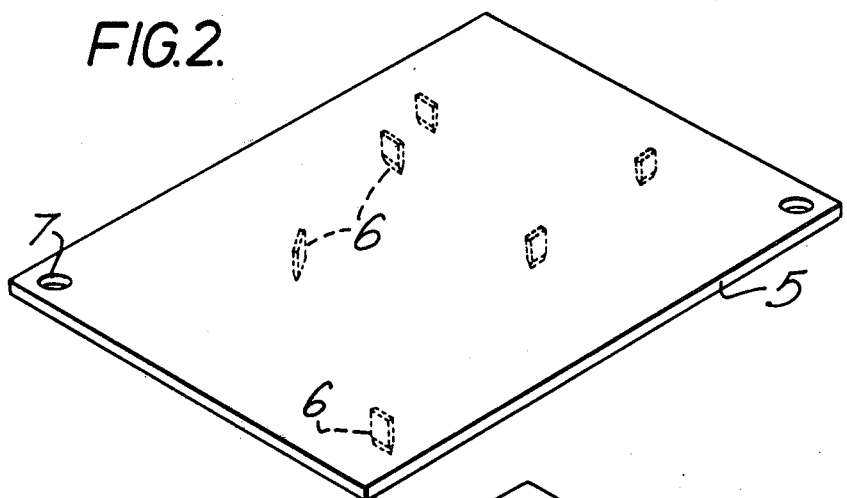
FIG. 2 is a perspective view of a carrier plate with cutting pins mounted thereon.

A carrier plate 5 (FIG. 2) carrying a plurality of cutting pins 6 is then aligned with the template 1 by means of location holes 7 at two diagonally opposed corners thereof, with the cutting pins 6 directed towards the grooved face of the template 1. The template 1 and carrier plate 5 are then urged towards each other such that the cutting pins 6 engage the length of wire 4 over holes 17 (FIG. 5) communicating with the groove 2 from the opposite face of the template 1 whereby the length of wire 4 is cut by the cutting pins 6 into a plurality of discrete pieces which remain in the groove 2.

Referring now to FIG. 7, a planar insulating support 8 of plastics material has a plurality of electrical terminals 9 mounted thereon, each terminal 9 having a slotted plate portion 10 projecting from one face of the support 8, this portion 10 having a slot therein to receive and establish an electrical connection to an insulated wire, in known manner, and an integrally formed contact portion 11, such as a tab or a tab receptacle, projecting from the opposite face of the support 8. The terminals 9 are mounted on the support 8 in any convenient known manner.

The support 8 has location holes 12 at two diagonally opposite corners whereby the support 8 with the terminals 9 thereon can be accurately located over the grooved side of the template 1 with the slotted plate portions 10 directed towards the grooved side of the template 1.

Figure 3:
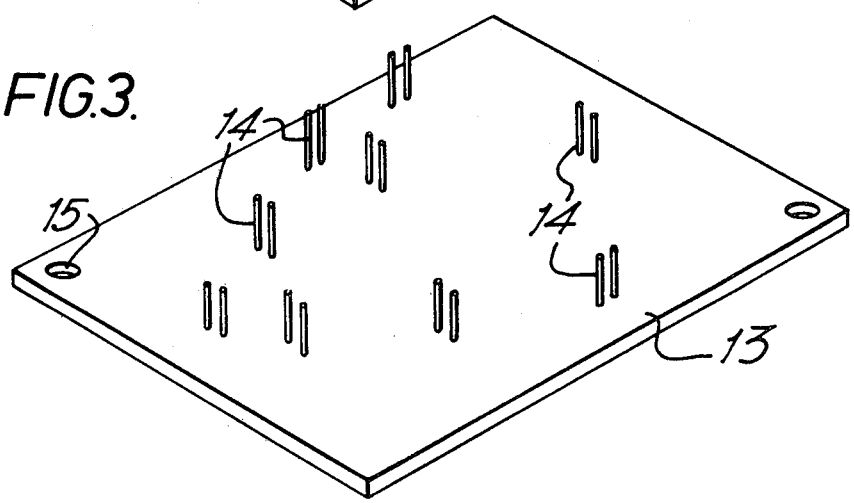
FIG. 3 is a perspective view of an ejection plate with ejection pins mounted thereon.

Referring now to FIG. 3 also, the template 1 with the pieces of wire in the groove 2 and with the insulating support 8 carrying the terminals 9 located as above described relative thereto, is positioned over an ejection plate 13 having a plurality of ejection pins 14 projecting therefrom. The ejection plate 13 has location holes 15 at two diagonally opposite corners to ensure accurate alignment with the template 1. The ejection plate 13 is then urged relatively towards the template 1 and the ejection pins 14 enter holes 16 (FIG. 6) in the template 1, which holes 16 lead into the groove 2 whereby the ejection pins 14 engage the pieces of wire 4 in the groove 2 and urge them out of the groove 2 and on to the slotted plate portions 10 of the terminals 9 carried by the support 8. The ejection pins 14 are located to ensure reliable ejection of the pieces of wire 4 from the groove 2, and in particular two ejection pins 14 are located to engage on opposite sides of and adjacent each terminal slotted plate portion 10 whereby these ejection pins 14 act, in known manner, as stuffers serving to stuff the piece of wire 4 into the slot in the slotted plate portion 10 as required.

The above described method produces an electrical interconnection assembly as shown in FIG. 8, comprising the insulating support 8 carrying the terminals 9 interconnected in a predetermined arrangement by the pieces of wire 4 engaged in the slots in their slotted plate portions 10 and with their contact portions 11 projecting from the opposite face of the support 8.

The insulating support 8 can be in the form of an insulating box with the contact portions 11 of the terminals accessible for connection to electrical leads and/or components, such a complete assembly being usable in an automobile to interconnect various parts of the wiring harness of the automobile and to connect components such as fuses and relays into the wiring harness.

If required the insulating support 8 can be formed as a plurality of pieces interconnected by integrally formed relatively thin web portions which will serve as hinges, whereby after manufacture as described above as a planar assembly the insulating support 8 can be folded about these hinges such that the pieces of the insulating support 8 lie in different planes, for example at right-angles relative to each other, to facilitate connection of leads and components to the contact portions 11 of the terminals 9 carried by the support 8. For example, for use in an automobile the support 8 can be formed in three pieces arranged in a row such that after folding the assembly and installation thereof in an automobile one end piece of the support 8 is directed towards the engine compartment, the other end piece is oppositely directed towards the passenger compartment, while the intermediate piece is upwardly directed to facilitate the mounting of components such as fuses and relays thereon.

What is claimed is:

1. A method of manufacturing an electrical interconnection assembly comprising a plurality of electrical terminals carried by a common electrically insulating support and interconnected in a predetermined arrangement by electrical conductors, the method including the steps of laying a continuous length of insulated electrical wire in a groove formed in a template; cutting the length of wire in the groove into a plurality of pieces; and urging the pieces of wire from the groove on to an insulating support carrying a plurality of electrical terminals each having a slotted plate portion providing an insulation displacement slot which receives a piece of wire and establishes an electrical connection thereto whereby the terminals become interconnected by the pieces of wire in the predetermined arrangement.

2. A method as claimed in claim 1, in which the wire has a solid core.

3. A method as claimed in claim 1, in which the length of wire is cut into a plurality of pieces while in the groove by means of an appropriate array of cutting pins projecting from a carrier plate which is urged towards the grooved side of the template, the cutting pins engaging the wire and cutting it against the sides of holes formed in the bottom of the groove into which holes the cutting pins pass after having cut the wire.

4. A method as claimed in claim 3, in which the pieces of wire in the groove in the template after the cutting operation are urged from the groove by means of an appropriate array of ejection pins carried by an ejection plate which is urged towards the face of the template remote from the groove, the ejection pins entering holes in the template communicating with the groove thereby to engage the pieces of wire and urge them out of the groove.

5. A method as claimed in claim 4, in which the array of ejection pins includes at least two associated with each terminal slotted plate portion, which two ejection pins engage a piece of wire on opposite sides of and adjacent the associated slotted plate portion thereby to serve as stuffers to urge the piece of wire into the slot in the associated slotted plate portion.

6. A method as claimed in claim 1, in which the electrical terminals each have a slotted plate portion projecting from one face of the insulating support for receipt of a piece of wire, and an integrally formed contact portion projecting from an opposite face of the insulating support for mating with a terminal terminating a conductor or device to be connected to the assembly.

7. A method as claimed in claim 6, in which the slotted plate portion of at least one terminal is provided with a plurality of slots, the groove in the template following the path necessary to direct the wire for connection in each of these slots.

8. A method as claimed in claim 6, including the step of mounting the insulating support carrying the terminals with the pieces of wire connected thereto in a box of insulating material with the contact portions of the terminals accessible from outside the box.

9. A method as claimed in claim 8, in which the members making up the box are formed with inwardly directed webs which project between the slotted plate and/or contact portions of adjacent terminals to prevent unwanted short circuit connections between such terminals.

10. A method as claimed in claim 1, in which the insulating support is formed as a plurality of pieces interconnected by integrally formed relatively thin web portions which will serve as hinges whereby after manufacture of an assembly as a planar assembly the insulating support can be folded about these hinges such that the pieces of the insulating support lie in different planes.

* * * * *